(12) United States Patent
Ohta

(10) Patent No.: US 6,336,463 B1
(45) Date of Patent: Jan. 8, 2002

(54) CLEANING/DRYING STATION AND PRODUCTION LINE FOR SEMICONDUCTOR DEVICES

(75) Inventor: Nahomi Ohta, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/280,702

(22) Filed: Mar. 30, 1999

(30) Foreign Application Priority Data

Mar. 31, 1998 (JP) .......................................... 10-085815

(51) Int. Cl.⁷ ................................................. B08B 3/04
(52) U.S. Cl. ..................... 134/61; 134/95.2; 134/102.3; 134/902
(58) Field of Search ...................... 134/61, 95.2, 102.3, 134/147, 153, 902, 100.1, 102.1, 102.2, 95.3; 34/58, 59, 315, 317, 318, 323, 326

(56) References Cited

U.S. PATENT DOCUMENTS

| | | | |
|---|---|---|---|
| 5,054,210 A | * | 10/1991 | Schumacher et al. |
| 5,092,937 A | * | 3/1992 | Ogura et al. |
| 5,105,556 A | * | 4/1992 | Kurokawa et al. |
| 5,271,774 A | * | 12/1993 | Leenaars et al. |
| 5,635,053 A | * | 6/1997 | Aoki et al. |
| 5,653,045 A | * | 8/1997 | Ferrell |
| 5,654,057 A | * | 8/1997 | Kitayama et al. |
| 5,725,753 A | * | 3/1998 | Harada et al. |
| 5,783,790 A | * | 7/1998 | Mitsumori et al. |
| 5,810,940 A | * | 9/1998 | Fukazawa et al. |
| 5,882,433 A | * | 3/1999 | Ueno |
| 5,986,875 A | * | 4/1999 | Yoneda |
| 5,922,136 A | * | 7/1999 | Huang |
| 6,043,162 A | * | 3/2000 | Shimizu et al. |
| 6,054,393 A | * | 4/2000 | Nicoli |
| 6,122,837 A | * | 9/2000 | Olesen et al. |

FOREIGN PATENT DOCUMENTS

| | | |
|---|---|---|
| JP | 5-3187 | 1/1993 |
| JP | 5-206092 | 8/1993 |
| JP | 8-17891 | 1/1996 |
| JP | 8-78384 | 3/1996 |
| JP | 8-102458 | 4/1996 |
| JP | 8-236491 | 9/1996 |

* cited by examiner

Primary Examiner—Frankie L. Stinson
(74) Attorney, Agent, or Firm—Sughrue Mion, PLLC

(57) ABSTRACT

A production line includes a centralized cleaning/drying station for cleaning a wafer by using an HF cleaning solution or a non-HF cleaning solution and subsequently drying the wafer based on the desired cleaning/drying conditions, and a transport system for transporting the wafer between each processing station and the centralized cleaning/drying station. The production line has a large flexibility for selecting the cleaning/drying conditions for the wafer with a reduced system size.

8 Claims, 8 Drawing Sheets

◻ :CLEANING DEVICE USING HF SOLUTION
△ :CLEANING DEVICE USING NON-HF SOLUTION
⊠ :IPA DRYING DEVICE
⊞ :SPIN DRYING DEVICE

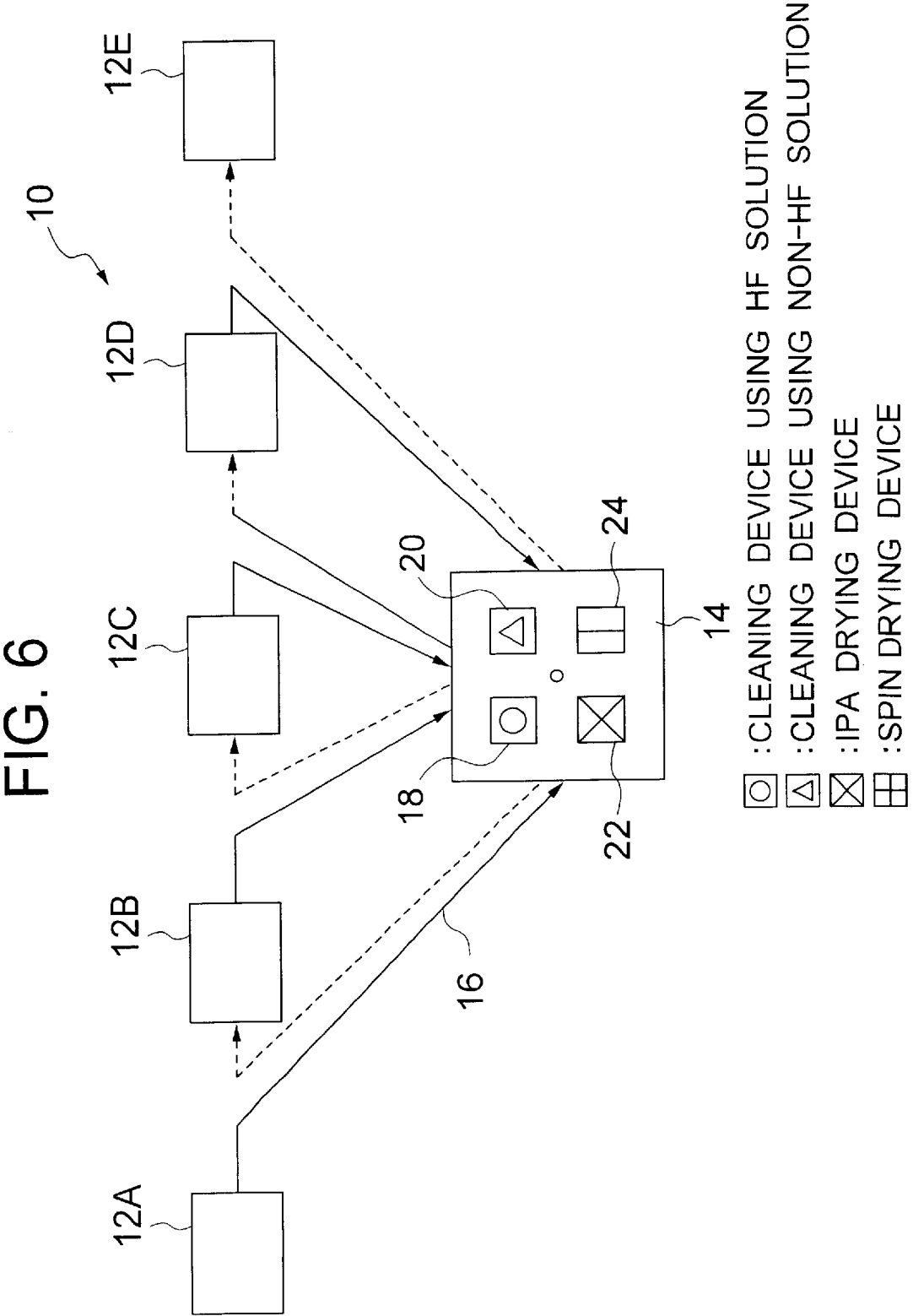

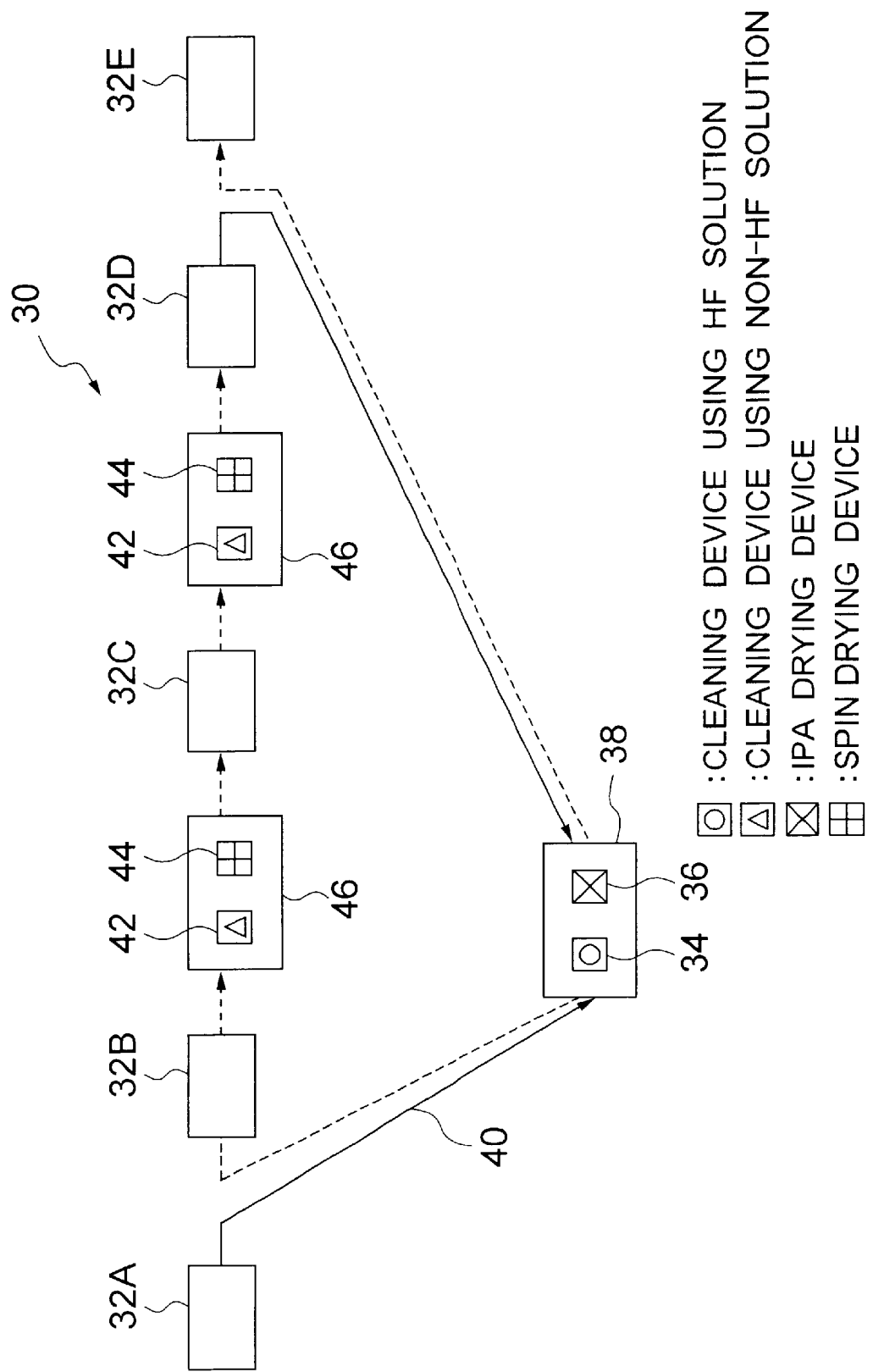

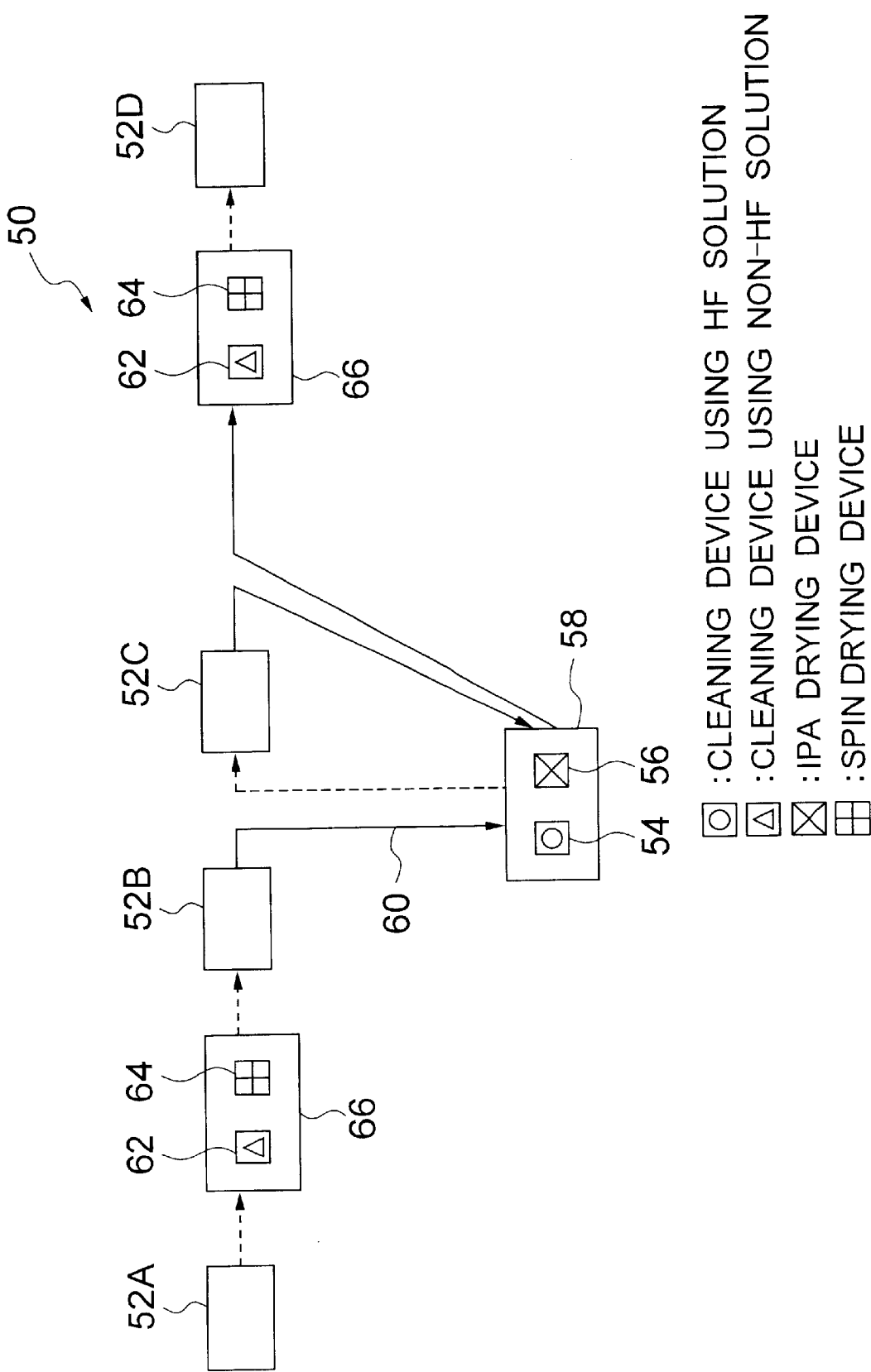

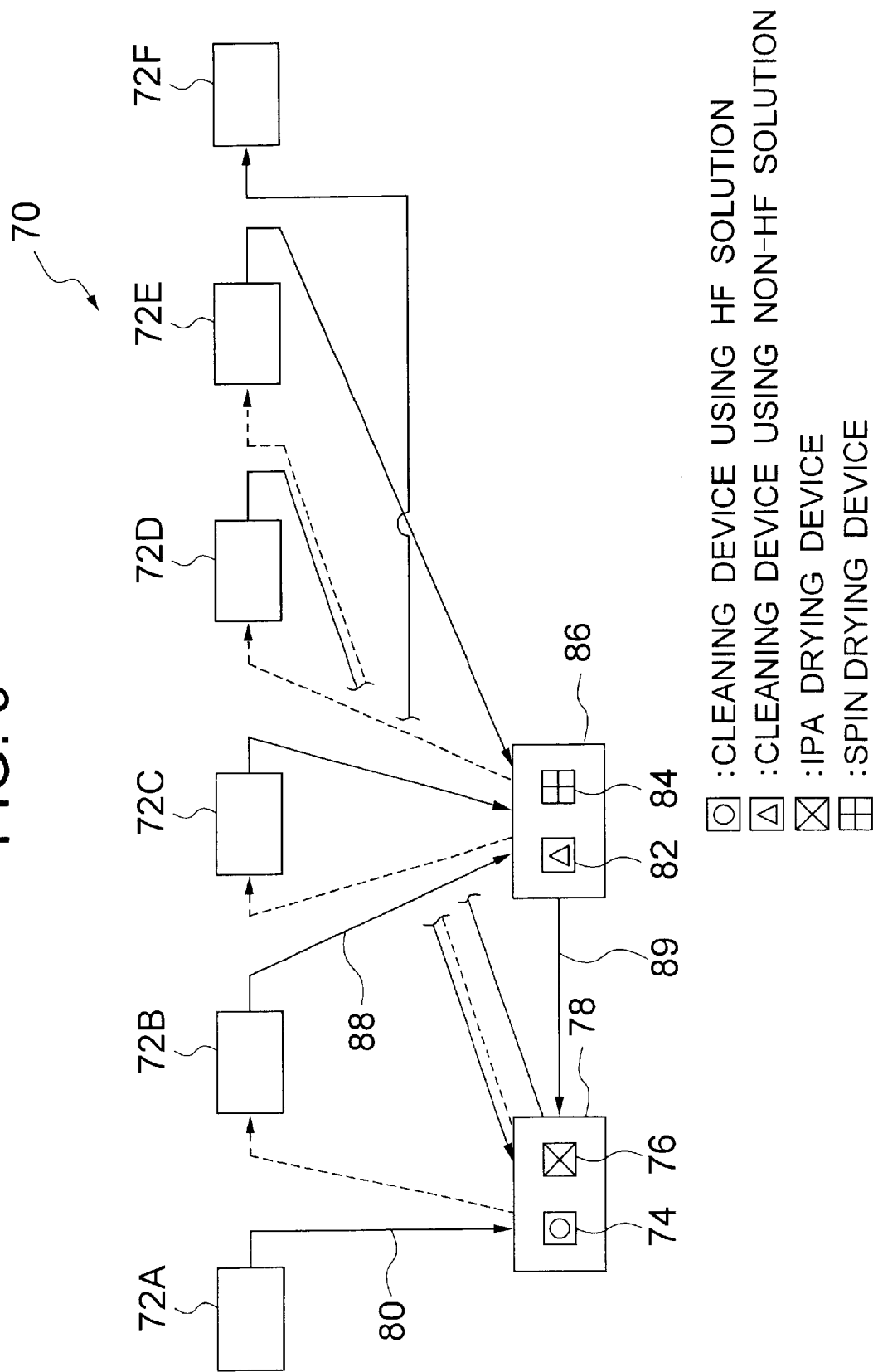

CLEANING/DRYING STATION AND PRODUCTION LINE FOR SEMICONDUCTOR DEVICES

BACKGROUND OF THE INVENTION (a) Field of the Invention

The present invention relates to a cleaning/drying station and a semiconductor device production line having the cleaning/drying station. More particularly, the present invention relates to a cleaning/drying system in a semiconductor device production line in which two different cleaning treatments (i.e., performances of cleaning) and two different drying treatments (i.e., performances of drying) can be selected with a high degree of flexibility, as well as to a production line for semiconductor devices having such a cleaning/drying system in which the layout or arrangement of cleaning devices and drying devices is optimized.

(a) Description of the Related Art

During fabrication of semiconductor devices, a cleaning treatment for wet-cleaning a wafer and a drying treatment for drying the wafer subsequent to the cleaning treatment are conducted before and after each of various processing treatments performed on the wafer.

For example, when a wafer is dry-etched, a cleaning treatment is first performed in order to remove contaminants from a dry-etched wafer surface, and a drying treatment is performed in order to dry the cleaned wafer. Such a cleaning treatment is almost inevitably performed before and after each processing treatment; e.g., before formation of a silicon oxide film on a wafer, after ion implantation, and before epitaxal growth. That is, in many cases, a cleaning treatment is performed between two successive processing treatments. Further, a drying treatment is generally performed after the cleaning treatment. In general, the cleaning treatment includes a chemical cleaning step for cleaning a wafer by use of chemical solution, and a rinse cleaning step for removing, by use of a rinsing liquid, the chemical solution remaking on the wafer.

A typical example of combined of a chemical cleaning step and a rinse cleaning step is an RCA cleaning process. The RCA process includes: a first step in which a wafer is cleaned by use of a mixed cleaning solution containing ammonium, hydrogen peroxide and water in predetermined ratios, followed by rinsing by use of purified water; a second step in which the wafer is immersed into a diluted-HF solution, followed by rinsing by use of purified water; and a third step in which a wafer is cleaned by use of a mixed solution containing hydrochloric acid, hydrogen peroxide and water in predetermined ratios, followed by rinsing by use of purified water.

Also, there is known a specific cleaning method in which both a native oxide film and metal contaminants are removed from a wafer through use of aqueous solution of hydrofluoric acid or hydrofluoric acid-hydrogen peroxide cleaning solution containing 0.5% hydrofluoric acid and 1–10% hydrogen peroxide, followed by rinsing the wafer by use of pure water.

In this text, processing by use of such a hydrofluoric acid based chemical solution will be referred to as "cleaning by use of an HF (cleaning) solution," and processing by use of non-hydrofluoric acid based chemical solution such as alkaline cleaning, acid cleaning, or RCA cleaning will be referred to as "cleaning by use of a non-HF (cleaning) solution."

Conventionally, a drying treatment after cleaning has been performed by use of a spin drying device. In the spin drying device, a cleaned wafer is rotated at a high speed in order to remove water remaining on the wafer after a rinsing step, by the effect of centrifugal force and air flow. The spin drying device can dry wafers at a high throughput, but cannot remove water completely, resulting in formation of water marks and the like on a wafer. The spin drying device is a typical example of a high throughput/low performance drying device and is mainly used in a drying treatment after a cleaning treatment performed by use of a non-HF cleaning solution, wherein a high drying performance is not generally required.

Conventional spin drying devices are classified into three types; i.e., a multi-cassette dryer, a single-cassette dryer, and a single-wafer dryer. An example of the single-cassette spin dryer is of a rotation-type in which, as shown in FIG. 1, a single cassette "C" carrying wafers "W" is received in a drum "D", which is rotated about an eccentric axis "E" An example of the multi-cassette spin dryer is of a revolution-type in which, as shown in FIG. 2, two cassettes "K" each carrying wafers "W" are received in a drum "D" to be located at diametrically opposite positions, and the drum "D" is rotated about a vertical rotational axis "F."

With an increase in the wafer deter for the semiconductor devices, a decrease in element dimensions and employment of multi-level wiring, the surface profile of the wafer including projections and depressions on the wafer surface has become finer and the level difference in the profile has increased. Thus, the aspect ratio of via holes has increased. Therefore, it has become difficult to dry wafers to a desired drying level by a spin drying method, resulting in occurrence of problems such as generation of water marks on the wafer surface, and an increased contact resistance of a via hole stemming from incomplete drying of the bottom portion of the via hole.

In order to solve the above-described problems, an IPA vapor drying technique making use of IPA (isopropyl alcohol) has recently come into practical use. As shown in FIG. 3, in an IPA vapor drying device using the IPA vapor drying technique, water droplets or a water film remaining on a wafer is replaced with condensed IPA, which is then allowed to drop and evaporate eventually. Thus, the wafer is dried.

Since the IPA vapor drying device (hereinafter simply referred to as an "IPA drying device") can almost completely replace water on a wafer with IPA and the IPA can evaporate after replacement, water marks are less likely to be generated. The IPA drying device is a typical example of a high performance/low throughput dryer and is used mainly in a drying treatment after a cleaning treatment making use of an HF cleaning solution, wherein a high drying performance is generally required Further, there has been developed a direct IPA drying method utilizing an integrated apparatus including a cleaning device and a drying device. In this method, cleaning, rinsing, and drying are performed within a closed space in order to minimize exposure of a wafer to an oxidizing atmosphere, which exposure would otherwise occur when the wafer is transported from a rinsing stage to a drying stage.

In a conventional production line for semiconductor devices, in order to secure a high throughput of a drying treatment, a high throughput/low performance drying device is provided after a cleaning treatment by use of non-HF cleaning solution, such as alkali cleaning, acid cleaning or RCA cleaning, which does not require a wafer to be dried to a high degree. On the other had, in order to secure a high quality of the drying treatment, a low throughput/high performance drying device is provided after a cleaning treatment, such as a chemical cleaning treatment making use of an HF cleaning solution.

With reference to FIG. 4, a conventional production line for semiconductor devices will be described. The conventional production line 90 includes a series of processing stations 92A–92E each performing a predetermined processing treatment on a wafer. A wafer is transported to the processing stations 92A–92E and is successively subjected to the respective processing treatments in the processing stations 92A–92E. In the production line 90, a cleaning/drying treatment must be performed for a wafer before and/or after the processing treatment at each processing station 92.

For example, in a step for forming a gate oxide film, an oxide film is wet-etched, and then a nitride film is wet-etched. During the wet etching of the oxide film, contaminants are dissolved into rinse droplets, resulting in contamination of a wafer surface. In order to suppress such contamination, a wafer is generally cleaned by use of an HF cleaning solution, and is subjected to IPA drying. Further, when plugs are formed in an inter-layer dielectric film on a wafer such that the plugs penetrate the dielectric film, the dielectric film is etched to form contact holes, which are then cleaned by use of a non-HF cleaning solution, and the wafer is subjected to spin drying. In such a process, in order to suppress generation of water marks, the wafer is cleaned by use of an HF cleaning solution and is then subjected to IPA dryimg.

In the production line 90, a cleaning treatment making use of an HF cleaning solution and a high performance drying treatment are conducted after the processing treatments performed at the processing stations 92A and 92D. Further, a cleaning treatment making use of a non-HF cleaning solution and a low performance drying treatment are conducted after the processing treatments performed at the processing stations 92B and 92C.

Therefore, in the conventional production line 90, a cleaning device 94 using an HF cleaning solution and an IPA drying device 96 are provided after each of the processing stations 92A and 92D, and a cleaning device 98 using a non-HF cleaning solution and a spin drying device 100 are provided after each of the processing stations 92B and 92C.

The conventional production line for semiconductor devices as described above involves the following problems.

First, each processing station is equipped with a combination of an HF cleaning device and a high performance drying device or a combination of a non-HF cleaning device and a low performance drying device. Therefore, flexibility in selection of cleaning treatments and drying treatments is low. For example, in order to cope with an increase in wafer diameter, a decrease in element dimensions and employment of multi-level wiring, the conventional cleaning condition which does not require HP cleaning solution is changed to the cleaning condition which requires HF cleaning solution. However, since only a combination of a non-HF cleaning device and a spin drying device is provided downstream of the relevant processing station in the conventional production line for semiconductor devices, the cleaning conditions are extremely difficult to change.

Further, when a low performance drying device is provided, drying cannot be performed to a sufficient degree after an HF processing treatment or the like which requires a high degree of drying, resulting in a problem occurring in subsequent steps. On the contrary, when a high performance drying device is provided despite only a low degree of drying being required, the throughput of the entire production line for semiconductor devices decreases, resulting in an increased production cost. If two kinds of drying devices; i.e., a high performance drying device and a low performance drying device, are employed in order to solve the problems described above, facility costs increase Second, there is a problem in that the throughput of the production line for semiconductor devices depends on the throughput of a drying device. For example, when a high performance drying device is provided, the throughput of the high performance drying device substantially determines the throughput of the entire production line for semiconductor devices.

Third, when a cleaning device and a drying device are provided before or after each processing station, a huge number of cleaning devices and drying devices are needed. Therefore, the facility costs of the cleaning and drying devices have been high, and costs involved in cleaning and drying wafers have been high. In addition, since only in rare cases do all the cleaning and drying devices operate at all times, the idle times of the cleaning and drying devices have been long.

In view of the problems involved in the conventional production line for semiconductor devices and in consideration of requirements for producing next generation wafers of 300 mm diameter, a cleaning device and a drying device must be provided in a production line in such a way as to improve the quality of cleaning and drying treatments for wafers, to decrease cleaning/drying cost, and to improve the flexibility of the treatments.

SUMMARY OF THE INVENTION

In view, of the foregoing, an object of the present invention is to provide a cleaning/drying system that provides cleaning and drying treatments in a highly flexible manner.

Another object of the present invention is to provide a production line for semiconductor devices that is optimized to increase the flexibility of cleaning and drying treatments.

The present invention provides a cleaning/drying system comprising a first cleaning device for cleaning a wafer by using an HF cleaning solution, a second cleaning device for cleaning a wafer by using a non-HF cleaning solution, a high-performance drying device for drying a wafer, and a high-speed drying device for drying a wafer at a higher speed and with a lower degree of drying than the high-performance drying device, wherein the first cleaning device and the second cleaning device is selected based on desired conditions for cleaning, and the high-performance drying device and the high-speed drying device is selected based on desired conditions for drying.

The present invention also provides a production line comprising: a series of processing stations each for processing a wafer in the production line based on a desired treatment; a cleaning/drying station including a first cleaning device for cleaning a wafer by using an HF cleaning solution, a second cleaning device for cleaning a wafer by using a non-HF cleaning solution, a high-performance drying device for drying a wafer, a high-speed drying device for drying a wafer at a higher speed and with a lower degree of drying than the high-performance drying device, wherein the first cleaning device or the second cleaning device is selected based on desired conditions for cleaning, and the high-performance drying device or the high-speed drying device is selected based on desired conditions for drying; a wafer transport system for transporting a wafer between each of the processing stations and the cleaning/drying station.

In accordance with the cleaning/drying system and the production line of the present invention, flexibility of selection of the cleaning device and the drying device can be improved substantially without increasing costs or space for the production line.

The above and other objects, features and advantages of the present invention will be more apparent from the following description, referring to the accompanying drawings.

BRIEF DESCRIPTION OF THE DRAWINGS

FIG. 6 is a schematic view of a production line for semiconductor devices according to a second embodiment of the present invention;

FIG. 7 is a schematic view of a production line for semiconductor devices according to a third embodiment of the present invention;

FIG. 8 is a schematic view of a production line for semiconductor devices according to a fourth embodiment of the present invention; and FIG. 9 is a schematic view of a production line for semiconductor devices according to a fifth embodiment of the present invention.

DESCRIPTION OF THE PREFERRED EMBODIMENTS

Figure 1:
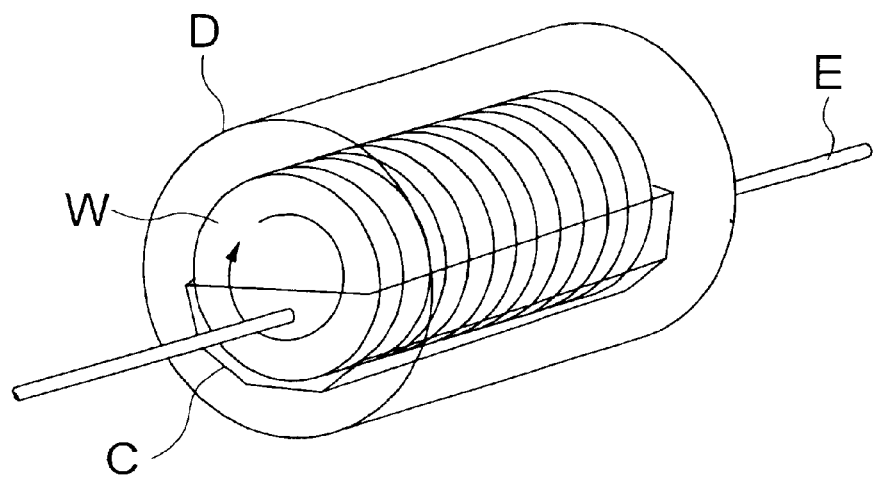
FIG. 1 is a schematic perspective view of a rotation-type spin drying device.
Figure 2:
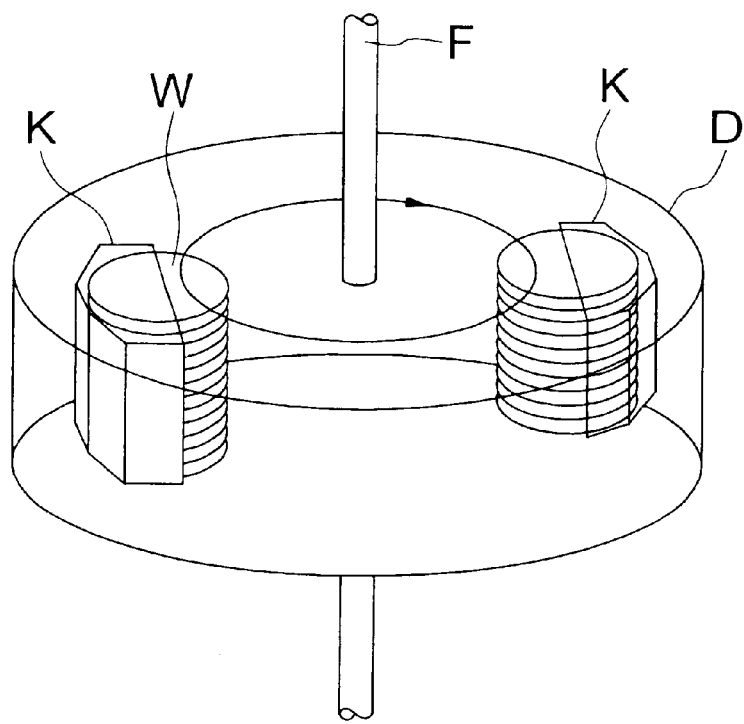
FIG. 2 schematic perspective view of a revolution-type spin drying device.
Figure 3:
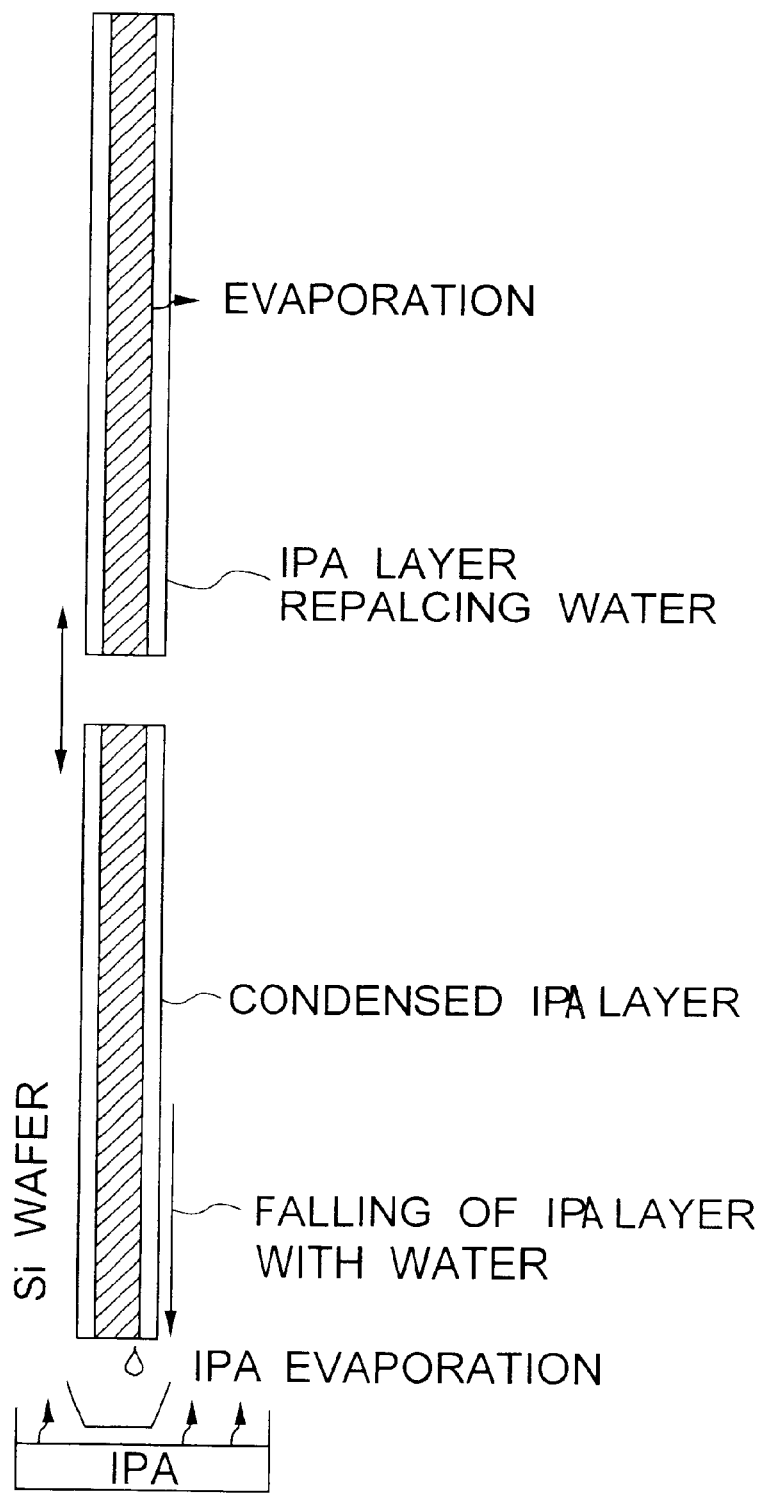
FIG. 3 is a schematic cross-sectional view showing the principle of an IPA drying method.
Figure 4:
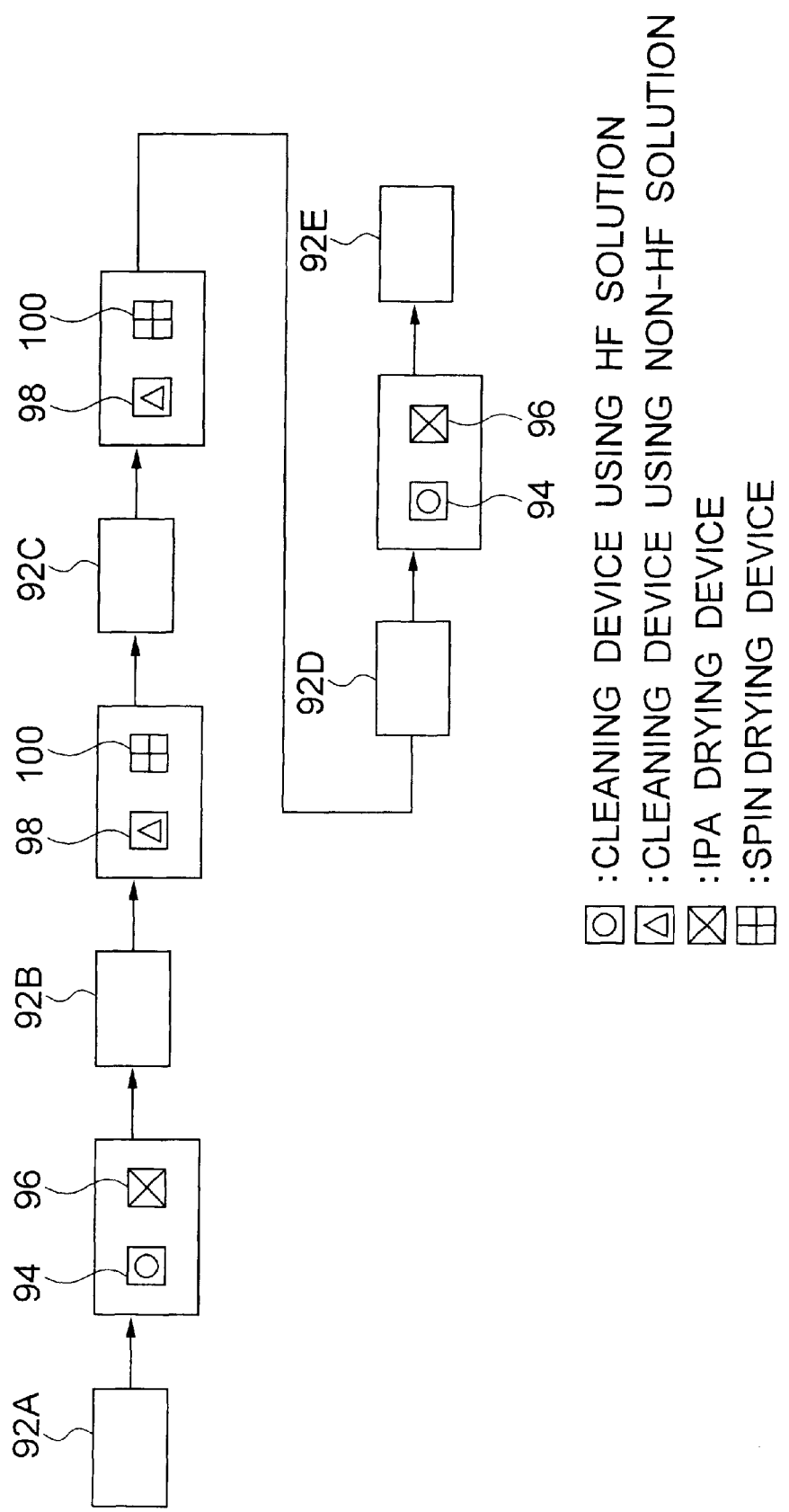
FIG. 4 is a schematic block diagram of a conventional production line for semiconductor devices.
Figure 5:
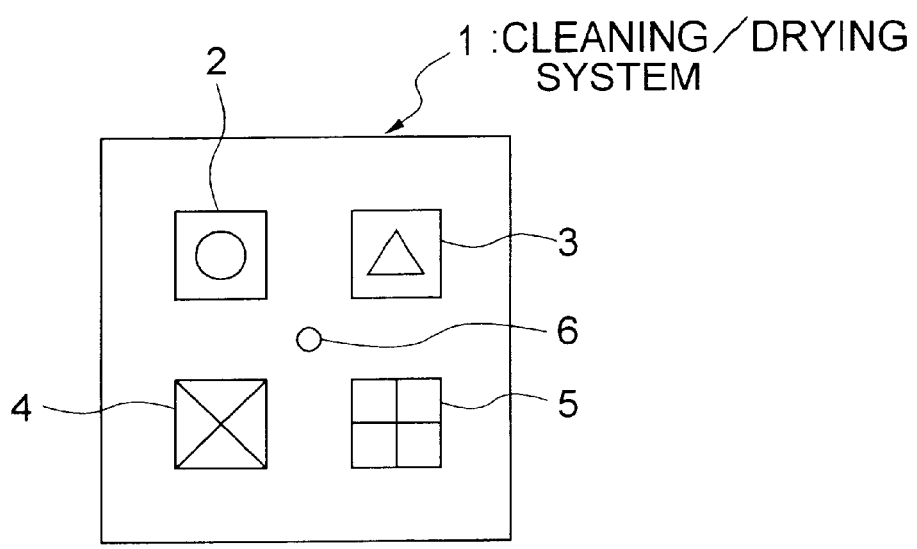
FIG. 5 is a schematic block diagram of a cleaning and drying system according to a first embodiment of the present invention.

Now, the present invention will be more specifically described with reference to the accompanying drawings.
First Embodiment Referring to FIG. 5, a cleaning/drying station 1 according to the present embodiment is adapted to cleaning/drying a wafer in the process for fabrication of semiconductor devices. The cleaning/drying station 1 includes a cleaning device 2 using an HF cleaning solution, a cleaning device 3 using a non-HF cleaning solution, an IPA drying device 4 serving as a high performance drying device, and a spin drying device 5 serving as a high speed drying device. Further, the cleaning/drying station 1 includes a wafer-handling robot 6 that can be operated by remote control. The robot 6 receives a wafer from outside the station 1, i.e., a processing station, at the first or second cleaning device 2 or 3, transports the wafer from the cleaning device 2 or 3 to the drying device 4 or 5, and transports the wafer from the drying device 4 or 5 to another processing station disposed for the next processing stage.

In the present embodiment, a desired cleaning device 2 or 8 is selected in accordance with desired cleaning conditions, and a desired drying device 4 or 5 is selected in accordance with desired drying conditions.
Second Embodiment Referring to FIG. 6, the present embodiment is directed to a production line 10 for fabrication of semiconductor devices and includes a series of processing stations 12A to 12E each performing a desired processing treatment on a wafer, and a cleaning/drying station 14. A wafer is transported to the processing stations 12A–12E and successively subjected to the respective processing treatments at the processing stations 12A to 12E. In the production line 10, a cleaning/drying treatment is performed at the cleaning/drying station 14 before and/or after the processing treatment at each processing station 12A to 12E.

The cleaning/drying station 14 is disposed in the production line 10 as a centralized station for performing cleaning and drying treatments in a centralized control for the production line 10. The production line 10 also includes a wafer transport system including a transport apparatus 16 for transporting wafers at a high speed between the processing stations 12A to 12E in the production line 10 and the single centralized cleaning/drying station 14. A limited number of centralized cleaning/drying stations (e.g., two stations) 14 may be disposed in the production line 10 instead.

The centralized cleaning/drying station 14 includes a cleaning device 18 making use of an HF cleaning solution, a cleaning device 20 making using of a non-HF cleaning solution, an IPA drying device 22 serving as performance drying device, and a spin drying device 24 serving as a high speed drying device. Further cleaning/drying station 14 includes a wafer-handling. robot (unillustrated) for handling wafers.

The wafer transport apparatus 16 for transporting wafers at a high speed is of a tube type and includes a network of transport tubes that are provided on the ceiling of a clean room and adapted to transporting wafers by means of linear motor. The interior of the transport tube is filled with an inert gas which provides an inert gas atmosphere for the wafers to thereby prevent contamination of the wafers during transportation. Each of the embodiments as described below also includes a wafer transport system of the tube type.

In the present embodiment, as illustrated by a solid line, wafers processed at the respective processing stations 12A to 12E are transported at a high speed to the centralized cleaning/drying station 14 by the wafer transport apparatus 16. Subsequently, the wafers are grouped, a suitable one of the cleaning devices 18 and 20 is selected in accordance with desired cleaning conditions, and a suitable one of the drying devices 22 and 24 is selected in accordance with the desired drying conditions. For example, wafers that require an HF cleaning treatment are cleaned by the cleaning device 18 making of an HF cleaning solution and are then dried by the IPA drying device 22. On the other hand, wafers that require a non-HF cleaning treatment are cleaned by the cleaning device 20 making use of a non-HP cleaning solution and are then dried by the spin drying device 24.

As illustrated by broken lines, dried wafers are further transported to the next stage processing station by the wafer transport apparatus 16 or by using ordinary transport means.

In the second embodiment, after processing at each processing station 12, wafers can be cleaned and dried through selective use of different kinds of cleaning devices 18 and 20 and drying devices 22 and 24 provided in the centralized cleaning/drying station 14. Therefore, flexibility in relation to selection of cleaning and drying treatments is improved.

In the present embodiment, by improving the throughput of the IPA drying device 22, the total throughput of the production line 10 can be improved. Further, by disposition of the centralized cleaning/drying station 14 at an optimal location, the layout of the production line 10 can be optimized.
Third Embodiment Referring to FIG. 7, a production line 30 of the present embodiment is also directed to fabrication of semiconductor devices, and includes a series of processing stations 32A–32E each performing a predetermined processing treatment on a wafer. The production line 30 further includes a single centralized cleaning/drying station 38, which includes an HF cleaning device 34, an IPA drying device 36 of a high performance, and a handling robot (unillustrated). A limited number of cleaning/drying stations 38 (e.g., two stations) may be disposed in the production line 30 instead. Further, a wafer transport apparatus 40 is provided in order to transport wafers at a high speed from the processing stations 32A and 32D to the centralized cleaning/drying station 38. On the other hand, a cleaning/drying stations 46 including a non-HF cleaning device 42 and a spin drying device 44 is provided as a distributed cleaning/drying station after each of the processing stations 32B and 32C.

A wafer is transported to the processing stations 32A–32E and is successively subjected to the respective processing treatments by the processing stations 32A–32E. In the production line 30, a wafer is subjected to a cleaning/drying treatment before and/or after the processing treatment at each processing station 32.

In the present embodiment, a cleaning treatment making use of an HF. cleaning solution and a high performance drying treatment are conducted after the processing treatments performed at the processing stations 32A and 32D. On the other hand, a cleaning treatment making use of a non-HF cleaning solution and a high speed drying treatment are conducted after the processing treatments performed at the processing stations 32B and 32C.

In the present embodiment, as illustrated by a solid line, wafers processed at the processing stations 32 and 32D are transported at a high speed to the centralized cleaning/drying station 38 by the wafer transport apparatus 40. Subsequently, the wafers are introduced by the handling robot into the HF cleaning device 34 and are cleaned by use of an HF cleaning solution. Subsequently, the wafers are introduced into the IPA drying device 36 and are subjected to an IPA drying treatment. As illustrated by broken lines, dried wafers are transported to the next processing station 32B or 32E by the wafer transport apparatus 40 or ordinary transport means.

The wafers processed at each of the processing stations 32B and 32C are transported to the corresponding distributed cleaning/drying station 46, at which the wafers are subjected to a non-HF cleaning treatment by the non-HF cleaning device 42 and are then subjected to spin drying by a spin drying device 44.

In the third embodiment, the HF cleaning device 34 and the IPA drying apparatus 36, provided in the centralized cleaning/drying station 38, perform an HF cleaning treatment and a high performance drying treatment while preventing growth of a native oxide film after processing at each of the processing stations 32A and 32D. The distributed cleaning/drying stations 46 can treat the wafers at a high speed without using the centralized station 38. By disposition of the centralized cleaning/drying station 38 at an optimal location and the distributed cleaning/drying stations 46 at desired locations, the layout of the production line 30 can be optimized.

Fourth Embodiment

Referring to FIG. 8, a production line 50 of the present embodiment is also directed to fabrication of semiconductor devices and includes a series of processing stations 52A–52D each performing a predetermined processing treatment on a wafer. A wafer is transported to the processing stations 52A–52D and is successively subjected to the respective processing treatments at the processing stations 52A–52D. In the production line 50, a cleaning/drying treatment is performed on a wafer before and/or after the processing treatment at each processing station 52.

In the present embodiment, a single centralized cleaning/drying station 58, which includes a non-HF cleaning device 54, a low performance spin drying device 56 and a handling robot (unillustrated), is disposed in the production line 50. However, a limited number of cleaning/drying stations 58 (e.g., two stations) may be provided in the production line 50 instead. A wafer transport apparatus 60 is provided in order to transport wafers at a high speed from the processing stations 52B and 52C to the centralized cleaning/drying station 58.

Distributed cleaning/drying stations 66 each including an HF cleaning device 62 and an IPA drying device 64 of a high performance are provided between the processing stations 52A and 52B and between the centralized cleaning/drying station 58 and the processing station 52D.

In the present embodiment, a cleaning treatment making use of an HF cleaning solution and a high performance drying treatment is conducted after the processing treatment performed at the processing station 52A. Further, a cleaning treatment making use of a non-HF cleaning solution and a low performance drying treatment is conducted after the processing treatment performed at the processing station 52B. Moreover, after the processing treatment at the processing station 52C, a cleaning treatment making use of a non-HF cleaning solution and a low performance drying treatment is performed and then a cleaning treatment making use of an HF cleaning solution and a high-performance drying treatment is performed.

As illustrated by a solid line, wafers processed at the processing station 52B are transported at a high speed to the centralized cleaning/drying station 58 by the wafer transport apparatus 60. Subsequently, the wafers are introduced by the handling robot into the non-HF cleaning device 54 and are cleaned by use of a non-HF cleaning solution. Subsequently, the wafers are introduced into the spin drying device 56 and are subjected to a spin drying treatment. As illustrated by broken lines, dried wafers are transported to the next processing station 52C by the wafer transport apparatus 60 or ordinary transport means.

As illustrated by the solid line, the wafers processed at the processing station 52C are transported at a high speed to the centralized cleaning/drying station 58 by the wafer transport apparatus 60. Subsequently, the wafers are introduced by the handling robot into the non-HF cleaning device 54 and are cleaned by use of a non-HF cleaning solution. Subsequently, the wafers are introduced into the spin drying device 56 and are subjected to a spin drying treatment. The dried wafers are transported by the wafer transport apparatus 60 to the distributed cleaning/drying station 66, where the wafers are subjected to an HF cleaning treatment at the HF cleaning device 62 and are then subjected to IPA drying at the IPA drying device 64. The dried wafers are then transported to the processing station 52D.

In the fourth embodiment, the non-HF cleaning device 54 and the spin dying apparatus 56, provided in the centralized cleaning/drying station 58, provides optimum selection of a non-HF cleaning treatment after processing at each processing station 52, so as to perform cleaning and drying treatment with a high throughput. Further, a selected combination of cleaning treatments can be obtained in which an HF cleaning treatment is performed subsequent to a non-HF cleaning treatment. Therefore, flexibility in relation to selection of cleaning and drying treatments is further improved.

By disposition of the centralized cleaning/drying station 58 at an optimal location, the layout of the production line 50 can be optimized.

Fifth Embodiment

Referring to FIG. 9, a production line 70 of the present embodiment is also directed to fabrication of semiconductor devices and includes a series of processing stations 72A–72F each performing a predetermined processing treatment on a wafer. A wafer is transported to the processing stations 72A–72F and is successively subjected to the respective processing treatments at the processing stations 72A–72F. In the production line 70, cleaning/drying treatment is performed for a wafer before and/or after the processing treatment at each processing station 72.

In the present embodiment, a single first centralized cleaning/drying station 78, which includes an HF cleaning device 74, an IPA drying device 76 of a high performance and a handling robot (unillustrated), is disposed in the production line 70. However, a limited number of first cleaning/drying stations may be provided in the production line 70 instead. A first wafer transport apparatus 80 is provided in order to transport wafers at a high speed from the processing stations 72A and 72D to the first centralized cleaning/drying station 78.

Also, a single second centralized cleaning/drying station 86, which includes a non-HF cleaning device 82, a spin drying device 84 of a low performance and a handling robot (unillustrated), is disposed in the production line 70. A limited number of cleaning/drying stations 86n may be disposed in the production line 70 instead. A second wafer transport apparatus 88 is provided in order to transport wafers at a high speed from the processing stations 72B, 72C, and 72E to the second centralized cleaning/drying station 86.

Moreover, a third wafer transport apparatus 89 is provided in order to transport wafers at a high speed from the second centralized cleaning/drying station 86 to the processing stations 72F via the first centralized cleaning/drying station 78.

In the present embodiment, a cleaning treatment making use of an HF cleaning solution and a high performance drying treatment are conducted after the processing treatments performed at the processing stations 72A and 72D. Further, a cleaning treatment making use of a non-HF cleaning solution and a high speed drying treatment are conducted after the processing treatments performed at the processing stations 72B and 72C. Moreover, after the processing treatment at the processing station 72E, a cleaning treatment making use of a non-HF cleaning solution and a high speed drying treatment is performed and then a cleaning treatment making use of an HF leaning solution and a high performance drying treatment are performed.

As illustrated by a solid line, wafers processed at the processing stations 72A and 72B transported at a high speed to the first centralized cleaning/drying station 78 by the wafer transport apparatus 80. Subsequently, the wafers are introduced by the handling robot into the HF cleaning device 74 and are cleaned by use of an HF cleaning solution. Subsequently, the wafers are introduced into the IPA drying device 76 and are subjected to an IPA drying treatment. As illustrated by broken lines, dried wafers are transported to the next processing station 72B or 72E by the wafer transport apparatus 80 or ordinary transport means.

As illustrated by a solid line, wafers processed at the processing stations 72B and 72C are transported at a high speed to the second centralized cleaning/drying station 86 by the wafer transport apparatus 88 The wafers are introduced by the handling robot into the non-HF cleaning device 82 and are cleaned by use of a non-HF cleaning solution. Subsequently, the wafers are introduced into the spin drying device 84 and are subjected to a spin drying treatment. As illustrated by broken lines, dried wafers are transported to the next processing station 72C or 72D by the wafer transport apparatus 88 or ordinary transport means.

As illustrated by a solid line, wafers processed at the processing station 72E are transported by the wafer transport 88 at high speed to the second centralized cleaning/drying station 86, where the wafers are cleaned by use of a non-HF cleaning solution and are then subjected to a spin drying treatment. As illustrated by a solid line, dried wafers are transported at a high speed to the first centralized cleaning/drying station 78, where the wafers are cleaned by use of an HF cleaning solution and are then subjected to an IPA drying treatment. As illustrated by a solid line, the dried wafers are transported to the next processing station 72F by the wafer transport apparatus 89.

In the fifth embodiment, there are provided the first centralized cleaning/drying station 78 including the HF cleaning device 74 and the IPA drying device 76, as well as the second centralized cleaning/drying station 86 including the non-HF cleaning device 82 and the spin drying device 84. Therefore, after processing treatment at each processing station 72, cleaning treatments and drying treatments can be freely selected. Further, there is an option in which an HF cleaning treatment is performed subsequent to a non-HF cleaning treatment. Therefore, flexibility in relation to selection of cleaning and drying treatments is improved:

By disposition of the first and second centralized cleaning/drying stations 78 and 86 at optimal locations, the layout of the production line 50 can be optimized.

The cleaning/drying device according to the present invention includes two kinds of cleaning devices providing different cleaning performances and two kinds of drying devices providing different drying performances. Therefore, a suitable cleaning device can be selected in accordance with d cleaning conditions, and A suitable drying device can be selected in accordance with desired drying conditions.

Further, in the production line according to the present invention, a centralized cleaning/drying device including two kinds of cleaning devices providing different cleaning performances and two kinds of drying devices providing different drying performances are disposed at suitable locations along the production line. Therefore, the flexibility in relation to cleaning/drying treatments can be increased, and the layout of the production line can be optimized.

Moreover, a centralized cleaning/drying device(es) and a distributed cleaning/drying device(es) can be formed through combination of different types of cleaning devices and drying devices. Therefore, the flexibility in relation to cleaning/drying treatments can be increased, and the layout of the production line can be optimized.

Since the above embodiments are described only for examples, the present invention is not limited to the above embodiments and various modifications or alterations can be easily made therefrom by those skilled in the art without departing from the scope of the present invention.

What is claimed is:

1. A cleaning/drying system comprising a first cleaning device for cleaning a wafer by using an HF cleaning solution, a second cleaning device for cleaning a wafer by using a non-HF cleaning solution, a high-performance drying device for drying a wafer, and a high-speed drying device for cleaning a wafer at a higher-speed and with a lower degree of drying by said high-performance drying device, said first cleaning device or said second cleaning device being selected based on desired conditions for cleaning, said high-performance drying device or said high-speed drying device being selected based on desired conditions for drying.

2. The cleaning/drying system as defined in claim 1, wherein said high-performance drying device and said high-speed drying device is selected based on whether the wafer is cleaned by said first cleaning device or said second cleaning device.

3. A production line comprising: a series of processing stations each for processing a wafer in the production line based on a desired treatment; a cleaning/drying station including a first cleaning device for cleaning a wafer by using an HF cleaning solution, a second cleaning device for cleaning a wafer by using a non-HF cleaning solution, a high-performance drying device for drying a wafer, a high-speed drying device for drying a wafer at a higher speed and with a lower degree of drying than said high-performance drying device, said first cleaning device or said second cleaning device being selected based on desired conditions for cleaning, said high-performance drying device or said high-speed drying device being selected based on desired conditions for drying; and a wafer transport system for transporting a wafer between each of said processing stations and said cleaning/drying station.

4. A production line comprising: a series of processing stations each for processing a wafer in the production line based on a desired treatment; at least one first cleaning/drying station including a first cleaning device for cleaning a wafer by using an HP cleaning solution and a high-performance drying device for drying the wafer cleaned by said first cleaning device; at least one second cleaning/drying station including a second cleaning device for cleaning a wafer by using a non-HF cleaning solution and a high-speed drying device for drying the wafer cleaned by said second cleaning device; and a wafer transport device for selectively transporting a wafer between each of said processing stations and said first cleaning/drying station or said second cleaning/drying device based on desired conditions for cleaning/drying.

5. The production line as defined in claim 4, wherein said first cleaning/drying station and said second cleaning/drying station are both centralized stations for the production line.

6. The production line as defined in claim 4, wherein said at least one first cleaning/drying station is a centralized station, and said at least one second cleaning station includes a plurality of distributed stations each disposed between two of said processing stations.

7. The production line as defined in claim 4, wherein said at least one first cleaning/drying station includes a plurality of distributed stations each disposed between two of said processing stations, and said at least one second cleaning station is a centralized station.

8. The production line as defined in claim 4, wherein said transport device transports a wafer between said processing station and said first cleaning/drying station via said second cleaning/drying station.

\* \* \* \* \*